United States Patent
Wilm

(10) Patent No.: US 9,171,884 B2
(45) Date of Patent: Oct. 27, 2015

(54) METHOD FOR COMBINING LEDS IN A PACKAGING UNIT AND PACKAGING UNIT HAVING A MULTIPLICITY OF LEDS

(75) Inventor: Alexander Wilm, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 88 days.

(21) Appl. No.: 13/823,935

(22) PCT Filed: Aug. 22, 2011

(86) PCT No.: PCT/EP2011/064380
§ 371 (c)(1),
(2), (4) Date: May 7, 2013

(87) PCT Pub. No.: WO2012/034827
PCT Pub. Date: Mar. 22, 2012

(65) Prior Publication Data
US 2013/0234176 A1    Sep. 12, 2013

(30) Foreign Application Priority Data

Sep. 16, 2010  (DE) .......................... 10 2010 045 576
Oct. 27, 2010  (DE) .......................... 10 2010 049 857

(51) Int. Cl.
*H01L 27/15*     (2006.01)
*F21K 99/00*     (2010.01)
(Continued)

(52) U.S. Cl.
CPC ................. *H01L 27/156* (2013.01); *F21K 9/90* (2013.01); *F21Y 2101/02* (2013.01); *F21Y 2105/003* (2013.01); *F21Y 2113/005* (2013.01)

(58) Field of Classification Search
CPC .................................................... H01L 21/156

USPC ............... 257/89, 98, 88, E33.056, E33.061; 438/15, 27, 20
See application file for complete search history.

(56) References Cited

U.S. PATENT DOCUMENTS 7,259,030 B2 *   8/2007   Daniels et al. .................. 438/22
7,736,017 B2    6/2010   Huang et al.
(Continued)

FOREIGN PATENT DOCUMENTS

DE         103 17 811 A1    11/2004
DE     10 2008 025 398 A1   12/2009
(Continued)

OTHER PUBLICATIONS

English translation of the Japanese Examination Report dispatched Feb. 17, 2014 from corresponding Japanese Patent Application No. 2013-528583.
(Continued)

*Primary Examiner* — Sheng Zhu
(74) *Attorney, Agent, or Firm* — DLA Piper LLP (US)

(57) ABSTRACT

A method of combining LEDs in a packaging unit includes determining a color locus of a multiplicity of LEDs, classifying the LEDs into a plurality of different color locus ranges, each LED classified into a color locus range comprising the determined color locus of the respective LED, arranging the LEDs in the packaging unit such that the packaging unit contains a plurality of successive sequences respectively of a plurality of LEDs, wherein each sequence respectively has exactly one LED from each of the color locus ranges, and the LEDs of the different color locus ranges are respectively arranged in the same order within the sequences.

4 Claims, 1 Drawing Sheet

(51) Int. Cl.
*F21Y 101/02* (2006.01)
*F21Y 113/00* (2006.01)
*F21Y 105/00* (2006.01)

(56) References Cited

U.S. PATENT DOCUMENTS

| | | | |
|---|---|---|---|
| 8,167,454 B2 | 5/2012 | Maier | |
| 2003/0016198 A1* | 1/2003 | Nagai et al. | 345/83 |
| 2004/0206665 A1 | 10/2004 | Lang | |
| 2004/0223327 A1* | 11/2004 | Kuan et al. | 362/249 |
| 2007/0029915 A1 | 2/2007 | Kim et al. | |
| 2008/0123355 A1* | 5/2008 | Wuu et al. | 362/419 |
| 2008/0225143 A1* | 9/2008 | Joffer et al. | 348/280 |
| 2008/0285268 A1* | 11/2008 | Oku et al. | 362/231 |
| 2009/0021937 A1 | 1/2009 | Sloan et al. | |
| 2009/0236262 A1 | 9/2009 | Shuai et al. | |
| 2009/0246895 A1* | 10/2009 | You et al. | 438/20 |
| 2009/0323334 A1 | 12/2009 | Roberts et al. | |
| 2010/0140633 A1 | 6/2010 | Emerson | |
| 2011/0174377 A1* | 7/2011 | Lee et al. | 136/262 |
| 2011/0228517 A1 | 9/2011 | Kawabat et al. | |
| 2011/0291123 A1 | 12/2011 | Hofmann et al. | |

FOREIGN PATENT DOCUMENTS

| | | |
|---|---|---|
| DE | 10 2008 033 391 A1 | 1/2010 |
| DE | 10 2008 064 073 A1 | 6/2010 |
| JP | 59-078584 A | 5/1984 |
| JP | 59-217399 | 12/1984 |
| JP | 61-59899 A | 3/1986 |
| JP | 2010/129953 | 6/2010 |
| WO | 2009/064363 | 5/2009 |

OTHER PUBLICATIONS

English translation of the Decision of Refusal dated Feb. 9, 2015 from corresponding Japanese Application No. 2013-528583.

* cited by examiner

METHOD FOR COMBINING LEDS IN A PACKAGING UNIT AND PACKAGING UNIT HAVING A MULTIPLICITY OF LEDS

RELATED APPLICATIONS

This application is a §371 of International Application No. PCT/EP2011/064380, with an international filing date of Aug. 22, 2011 (WO 2012/034827 A1, published Mar. 22, 2012), which is based on German Patent Application Nos. 10 2010 045 576.8, filed Sep. 16, 2010, and 10 2010 049 857.2, filed Oct. 27, 2010, the subject matter of which is incorporated herein by reference.

TECHNICAL FIELD

This disclosure relates to a method for combining LEDs in a packaging unit and to a packaging unit having a multiplicity of LEDs.

BACKGROUND

Owing to their high efficiency, LEDs are being used increasingly in LED lamps for general lighting or in automobile headlamps. It is then often the case that a plurality of LED lamps are operated next to one another, in which case the LED lamps may respectively contain a plurality of LEDs.

So that different LED lamps arranged next to one another offer a homogeneously colored appearance, it is desirable for the radiation emitted by the different LED lamps respectively to have the same color locus. In the manufacture of LEDs, however, it cannot be ruled out that minor color differences of the individual LEDs may occur, particularly in the case of LEDs from different production batches. For this reason, LEDs are often grouped by the LED manufacturer before delivery (so-called "binning"), a group of LEDs (the so-called "bin") being distinguished, for example, in that all LEDs of this group have the same color locus. If, in the production of LED lamps, only LEDs of a single group are used, this ensures that all lamps equipped with these LEDs have the same color locus. In this case, however, it is necessary that the customer of the LED manufacturer, who further processes the individual LEDs to form LED lamps, respectively only uses LEDs from the same LED group so that all lamps of different manufacturing batches have the same color locus. Alternatively, it would also be conceivable for a lamp manufacturer deliberately to select a plurality of LEDs from different LED groups with a different color locus to equip an LED lamp such that the lamp containing a plurality of LEDs overall has the desired target color locus. This would have the advantage that the lamp manufacturer could use LEDs from groups with a different color locus, but on the other hand leads to increased production outlay since LEDs from different packaging units would have to be used to equip an individual LED lamp.

On this basis, it could thus be helpful to provide a method for combining LEDs in a packaging unit by which LED components having a plurality of LEDs from the packaging unit and/or from different packaging units can have the least possible differences in terms of color locus.

SUMMARY

I provide a method of combining LEDs in a packaging unit, including determining a color locus of a multiplicity of LEDs, classifying the LEDs into a plurality of different color locus ranges, each LED classified into a color locus range including the determined color locus of the respective LED, arranging the LEDs in the packaging unit such that the packaging unit contains a plurality of successive sequences respectively of a plurality of LEDs, wherein each sequence respectively has exactly one LED from each of the color locus ranges, and the LEDs of the different color locus ranges are respectively arranged in the same order within the sequences.

I also provide a packaging unit having a multiplicity of LEDs including LEDs from a plurality of different color locus ranges, wherein each LED is assigned to one of the color locus ranges including the color locus of radiation emitted by the respective LED during operation, the LEDs are arranged in the packaging unit in a plurality of successive sequences respectively of a plurality of LEDs, each sequence respectively including exactly one LED from each of the color locus ranges, and the LEDs of the different color locus ranges are respectively arranged in the same order within the sequences.

DETAILED DESCRIPTION

Figure 1:
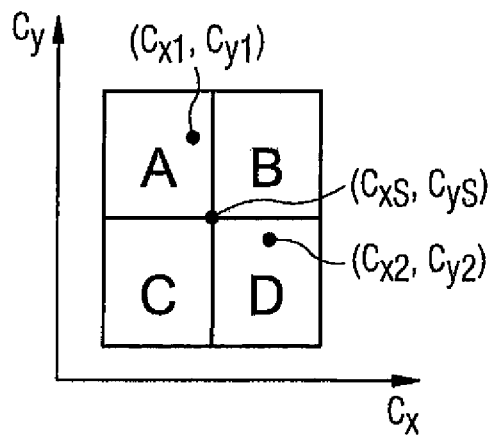
FIG. 1 shows a schematic representation of the classification of LEDs into different color locus ranges of a color space with the aid of their determined color locus.

In my method, the color locus of a multiplicity of LEDs may initially be determined. The color locus of an LED may, for example, be determined by measuring the light emitted by the LED during operation with a spectrophotometer. The color locus is preferably determined in a normalized color space system. In particular, the color locus may be determined in a CIE color space system. The color locus of an LED may, for example, be represented by the coordinates ($C_x$, $C_y$) in the CIE color space system. Minor differences in the color impression of the LEDs which may possibly occur during production of LEDs can be represented by different color loci ($C_x$, $C_y$).

In a further method step, the LEDs are classified into a plurality of color locus ranges, each LED being classified into a color locus range comprising the determined color locus of the respective LED.

The color space system used, for example, the CIE color space system, is to this end subdivided into a plurality of mutually different color locus ranges so that each LED can be classified into one of the color locus ranges with the aid of the determined color locus.

Subsequently, the LEDs in a packaging unit are arranged such that the packaging unit contains a plurality of sequences of LEDs, each sequence having exactly one LED from each of the color locus ranges, and the LEDs of the different color locus ranges respectively being arranged in the same order within the sequences.

The packaging unit thus contains LEDs of different color locus ranges arranged in a predetermined order in the packaging unit. This has the advantage that the customer obtains a uniform mixture of LEDs of different color loci when taking a multiplicity of LEDs from the packaging unit in the order in which the LEDs are arranged in the packaging unit. LED lamps containing a multiplicity of the LEDs taken from the packaging unit in this way therefore have only a minor or even no difference in the resulting color locus from one another. The resulting color locus is in this case the color locus which the light emitted simultaneously by the plurality of LEDs contained in the lamp has.

In the method, LEDs of the same color are preferably combined in the packaging unit. The classification of the LEDs into different color locus ranges thus in particular does not mean that the LEDs have different colors, for example, red, green, blue or white, but that they have minor differences in the color impression of a single color. The color locus ranges are preferably selected such that they cover the variance occurring in production for the actually measured color loci of the LEDs. The method may be used for LEDs of any color and, in particular, for LEDs emitting white light.

The number of color locus ranges into which the LEDs are classified is preferably 3 to 8.

If the LEDs are classified, for example, into four color locus ranges, each of the sequences arranged in the packaging unit contains four LEDs, each sequence containing exactly one LED from each of the four color locus ranges in a predetermined order. If the packaging unit contains, for example, 1000 LEDs, 250 sequences of four LEDs each in the predetermined order are respectively arranged in the packaging unit. If four successive LEDs are taken from the packaging unit in this case, they respectively have a uniform mixture of all four color locus ranges.

This is also the case when the number of LEDs taken corresponds to an integer multiple of the color locus ranges, i.e., when, for example, with classification of the LEDs into four color locus ranges, eight, twelve, sixteen and the like. LEDs are taken from the packaging unit. When the number of LEDs taken from the packaging unit corresponds to an integer multiple of the number of color locus ranges, a uniform mixture of LEDs of the different color locus ranges is always taken, irrespective of whether the first LED taken is arranged at the start of a sequence.

If the LEDs arranged in the packaging unit are intended to be mounted in an LED lamp having a plurality of LEDs, it is advantageous for the classification into color locus ranges to be adapted to the number of LEDs in the lamp such that the number of LEDs in the lamp corresponds to an integer multiple of the number of color locus ranges. If, for example, an LED lamp contains twelve LEDs, it is advantageous for the LEDs to be classified into three or four color locus ranges since in this case a whole number of sequences is always taken from the packaging unit when twelve LEDs are taken so that the lamp has an equally large number of LEDs from each of the color locus ranges.

A good mixture of LEDs of different color locus ranges is also achieved when the number of LEDs of a unit successively taken from the packaging unit is large in comparison with the number of color locus ranges. The number of LEDs from different color locus ranges respectively differs by at most one for a plurality of units taken from the packaging unit so that no significant difference between the resulting color loci of the units occurs in the case of a large number of LEDs per unit.

Advantageously, the start of the sequences arranged in the packaging unit may respectively be marked. If, in this case, a fixed number of LEDs is respectively taken from the start of a sequence out of the packaging unit, this ensures that different sequences taken respectively have the same composition of LEDs of different color loci even if the number of LEDs taken is not equal or not equal to an integer multiple of the number of LEDs in a sequence.

A packaging unit preferably contains 500 to 20,000 LEDs, particularly preferably 1000 to 10,000 LEDs.

As the packaging unit, a roll is preferably used on which the sequences of LEDs are successively arranged. The LEDs are preferably fixed on the roll such that they can be taken easily from the roll. In particular, the roll may have an adhesive tape onto which the LEDs are adhesively bonded.

The packaging unit may contain a multiplicity of LEDs from a plurality of different color locus ranges. Each of the LEDs may be assigned to a color locus range comprising the color locus of the radiation emitted by the respective LED during operation. The LEDs are arranged in the packaging unit in a plurality of successive sequences, each of a plurality of LEDs, each sequence respectively comprising exactly one LED from each of the color locus ranges, and the LEDs of the different color locus ranges respectively being arranged in the same order within the sequences.

The packaging unit is preferably a roll on which the sequences of LEDs are successively arranged. Advantageously, the start of the sequences respectively has a marking. The number of color locus ranges, which is equal to the number of LEDs in a sequence, is preferably 3 to 8. The packaging unit preferably contains in total 500 to 20,000 LEDs, particularly preferably 1000 to 10,000 LEDs.

Other advantageous properties of the packaging unit may be found in the preceding description of the method, and vice versa.

My packaging units and methods will be explained in more detail below with the aid of examples in conjunction with FIGS. 1 to 3.

Components which are the same or have the same effect are respectively provided with the same references in the figures. The components represented and the size proportions of the components with respect to one another are not to be regarded as true to scale.

In the method for combining LEDs in a packaging unit, the color locus of a multiplicity of LEDs is initially determined. As schematically represented in FIG. 1, the color locus of an LED may in particular be represented by the coordinates $C_x$, $C_y$ in the normalized CIE color space. The measurement of the color locus of the multiplicity of LEDs may, for example, be carried out in a spectrophotometer. For example, in this case a color locus ($C_{x1}$, $C_{y1}$) is determined for the first of a multiplicity of LEDs and a color locus ($C_{x2}$, $C_{y2}$) is determined for the second LED. In the same way, the color loci ($C_{xn}$, $C_{yn}$), for n=1 to N, are determined for a multiplicity of N LEDs which are combined in a packaging unit.

Subsequently, the LEDs are classified into a plurality of different color locus ranges A, B, C, D. The color locus ranges A, B, C, D are subregions of the color space, in particular of the CIE color space, the color locus ranges A, B, C, D advantageously being selected such that they are uniformly arranged around a setpoint color locus ($C_{xS}$, $C_{yS}$) and together cover variances occurring in production of the LEDs for the actually determined color loci around this setpoint value. The color locus ranges A, B, C, D preferably do not mutually overlap so that each LED can be assigned to exactly one color locus range A, B, C, D. In the method, each of the multiplicity of LEDs is classified into one of the color locus ranges A, B, C, D comprising the determined color locus of the respective LED. In the example of FIG. 1, a first LED with the color coordinates ($C_{x1}$, $C_{y1}$) is classified into the color locus range A and a second LED with the color coordinates ($C_{x2}$, $C_{y2}$) is classified into the color locus range D. In this way, all LEDs intended to be combined to form packaging units are classified into the color locus ranges A, B, C, D.

Figure 2:
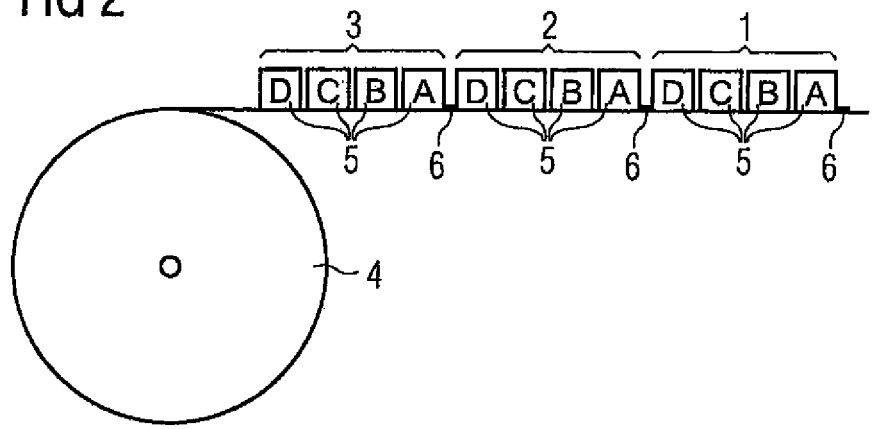
FIG. 2 shows a schematic representation of the arrangement of a plurality of sequences of LEDs on a roll functioning as a packaging unit according to one example.

As represented in FIG. 2, the LEDs are subsequently arranged in a packaging unit 4 such that the packaging unit 4 contains a plurality of successive sequences 1, 2, 3 each of a plurality of LEDs 5, each sequence 1, 2, 3 having exactly one LED 5 from each of the color locus ranges A, B, C, D and the LEDs 5 of the different color locus ranges A, B, C, D respectively being arranged in the same order within the sequences 1, 2, 3.

The packaging unit 4 may in particular be a roll, on which the sequences of LEDs 1, 2, 3 are arranged successively. In FIG. 2, only three sequences 1, 2, 3 comprising a total of 12 LEDs are represented to simplify the representation. In fact, the roll used as a packaging unit 4 may, for example, comprise 500 to 20,000 LEDs 5. For example, the sequences 1, 2, 3 respectively contain exactly four LEDs since the LEDs 5 have been classified into four color locus ranges in the example. In particular, the sequences 1, 2, 3 respectively contain exactly one LED from each of the color locus ranges A, B, C, D, the LEDs 5 in each of the sequences 1, 2, 3 being arranged in the same order in terms of their assignment to the color locus ranges A, B, C, D.

This arrangement of the LEDs 5 in the packaging unit 4 has the advantage that, when taking a multiplicity of LEDs 5, it ensures that the color loci of the individual LEDs 5 are uniformly arranged around the setpoint value. This is the case in particular when the number of LEDs 5 taken is equal to the number of LEDs 5 in one of the sequences 1, 2, 3 or an integer multiple thereof. If, in the example in which the LEDs 5 have been classified into four color locus ranges, m*4 LEDs 5 are taken, m being an integer, the number of LEDs taken from the packaging unit 4 has equally many LEDs from each of the color locus ranges A, B, C, D. This is independent of whether or not the first LED 5 taken is arranged at the start of one of the sequences 1, 2, 3.

It is possible for the packaging unit 4 to have markings 6 which respectively mark the start of a new sequence 1, 2, 3. This is advantageous in particular when, for different LED components, a number of LEDs is intended to be taken from the packaging unit 4 which is not equal to the number of LEDs 5 in the sequences 1, 2, 3 or corresponds to an integer multiple thereof. When the number of LEDs 5 is respectively taken from the start of a sequence in this case, it is ensured that the components equipped with the LEDs 5 respectively have the same number of LEDs 5 from the color locus ranges A, B, C, D as one another, the number of LEDs 5 from the different color locus ranges differing by at most one in an individual LED component.

If, for example, in the example of FIG. 2 seven LEDs 5 are respectively taken from the start of one of the sequences 1, 2, 3, the LEDs 5 taken respectively comprise two LEDs 5 from the color locus ranges A, B, C and one LED 5 from the color locus range D. The color loci of the radiation emitted overall by a plurality of LED components of the same type equipped with such LEDs 5 will therefore advantageously differ only slightly or not at all from one another.

Figure 3:
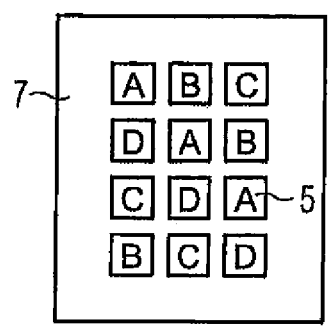
FIG. 3 shows a schematic representation of an LED lamp having a plurality of LEDs taken from a packaging unit according to another example.

FIG. 3 schematically represents an LED lamp 7 equipped, for example, with twelve LEDs 5 taken from the packaging unit 4 of FIG. 2. When equipping the LED lamp 7, the LEDs are taken from the packaging unit 4 in the order of their arrangement, for example, with an automatic applicator machine. Since the LEDs 5 with which the LED lamp 7 is equipped have been taken successively from the packaging unit 4, the LED lamp 7 advantageously has respectively equally many LEDs 5 of the color locus ranges A, B, C, D. The effect advantageously achieved is that the color locus of the light emitted by all of the LEDs 5 in the LED lamp 7 together lies comparatively close to the desired color locus, even though the individual LEDs 5 of the LED array 7 may have slightly different color loci. In particular, the effect is that, when manufacturing a plurality of LED lamps 7, the LED lamps 7 have only minor differences from one another in the resulting color locus of the emitted radiation.

My packaging units and methods are not restricted by the description with reference to the examples. Rather, this disclosure covers any new feature and any combination of features, which includes in particular any combination of features in the appended claims, even if the feature or combination is not explicitly indicated per se in the claims or examples.

The invention claimed is:

1. A method of combining LEDs in a packaging unit, comprising:
    determining a color locus of a multiplicity of LEDs having the same color,
    classifying the LEDs into a plurality of different color locus ranges, each LED classified into a color locus range comprising the determined color locus of the respective LED,
    arranging the LEDs in the packaging unit such that the packaging unit contains a plurality of successive sequences respectively of a plurality of LEDs,
    taking the LEDs from the packaging unit, and
    mounting the LEDs in an LED lamp,
    wherein each sequence respectively has exactly one LED from each of the color locus ranges, the LEDs of the different color locus ranges are respectively arranged in the same order within the sequences, and the packaging unit is a roll on which the sequences are successively arranged.

2. The method according to claim 1, wherein the LEDs are classified into 3 to 8 color locus ranges.

3. The method according to claim 1, wherein 500 to 20,000 LEDs are arranged in the packaging unit.

4. The method according to claim 1, wherein the start of the sequences arranged in the packaging unit is respectively marked.

* * * * *